United States Patent
Deshmukh

(10) Patent No.: US 6,830,999 B2
(45) Date of Patent: Dec. 14, 2004

(54) METHOD OF FABRICATING FLIP CHIP SEMICONDUCTOR DEVICE UTILIZING POLYMER LAYER FOR REDUCING THERMAL EXPANSION COEFFICIENT DIFFERENTIAL

(75) Inventor: Rajan D. Deshmukh, Pennington, NJ (US)

(73) Assignee: Agere Systems Inc., Allentown, PA (US)

( * ) Notice: Subject to any disclaimer, the term of this patent is extended or adjusted under 35 U.S.C. 154(b) by 3 days.

(21) Appl. No.: 10/173,182

(22) Filed: Jun. 17, 2002

(65) Prior Publication Data

US 2002/0197768 A1 Dec. 26, 2002

Related U.S. Application Data

(60) Division of application No. 09/609,582, filed on Jun. 30, 2000, now Pat. No. 6,441,473, which is a continuation-in-part of application No. 08/928,939, filed on Sep. 12, 1997, now abandoned.

(51) Int. Cl.[7] ............................................. H01L 21/44
(52) U.S. Cl. ...................... 438/612; 438/613; 438/622; 438/623
(58) Field of Search .................................. 438/106, 108, 438/110, 112, 113, 118, 584, 597, 612, 613, 618, 622, 623, 624, 455, 458, 460; 228/101, 178, 179.1, 180.1, 180.21, 180.22; 29/854, 825, 829, 874, 876, 884

(56) References Cited

U.S. PATENT DOCUMENTS

| | | | |
|---|---|---|---|
| 5,086,558 A | * 2/1992 | Grube et al. .................. 29/832 |
| 5,120,678 A | 6/1992 | Moore et al. ................ 437/183 |
| 5,148,266 A | * 9/1992 | Khandros et al. ............ 257/773 |
| 5,237,130 A | 8/1993 | Kulesza et al. ............. 174/260 |
| 5,346,861 A | * 9/1994 | Khandros et al. ............. 438/15 |
| 5,489,804 A | 2/1996 | Pasch ......................... 257/778 |
| 5,569,203 A | 10/1996 | Chen ........................... 604/110 |
| 5,679,977 A | * 10/1997 | Khandros et al. ........... 257/692 |
| 5,682,061 A | * 10/1997 | Khandros et al. ........... 257/666 |
| 5,720,100 A | 2/1998 | Skipor et al. ................. 29/840 |
| 5,757,078 A | * 5/1998 | Matsuda et al. ............. 257/737 |
| 5,801,446 A | * 9/1998 | DiStefano et al. .......... 257/778 |
| 5,841,193 A | 11/1998 | Eichelberger ................ 257/723 |
| 5,844,304 A | * 12/1998 | Kata et al. .................. 257/620 |
| 5,848,467 A | * 12/1998 | Khandros et al. ............. 29/841 |
| 5,865,365 A | 2/1999 | Nishikawa et al. .......... 228/223 |
| 5,928,001 A | 7/1999 | Gillette et al. ................ 439/67 |
| 5,955,780 A | * 9/1999 | Suzuki et al. ................ 257/690 |
| 5,994,781 A | * 11/1999 | Smith ......................... 257/773 |
| 6,028,354 A | * 2/2000 | Hoffman ..................... 257/706 |
| 6,150,194 A | * 11/2000 | Sakaguchi et al. .......... 438/118 |
| 6,190,940 B1 | * 2/2001 | DeFelice et al. ............ 438/106 |
| 6,211,572 B1 | * 4/2001 | Fjelstad et al. ............. 257/781 |
| 6,239,489 B1 | * 5/2001 | Jiang .......................... 257/738 |
| 6,274,391 B1 | * 8/2001 | Wachtler et al. ............... 438/6 |
| 6,323,542 B1 | * 11/2001 | Hashimoto .................. 257/669 |
| 6,441,473 B1 | * 8/2002 | Deshmukh .................. 257/669 |
| 2002/0130412 A1 | * 9/2002 | Nagai et al. ................. 257/737 |

FOREIGN PATENT DOCUMENTS

| | | | | |
|---|---|---|---|---|
| EP | WO9609746 | * | 3/1996 | |
| JP | 52087983 A | * | 7/1977 | ........... H01L/21/31 |
| JP | 01155633 A | * | 6/1989 | ........... H01L/21/60 |
| JP | 11354560 A | * | 12/1999 | ........... H01L/21/60 |

* cited by examiner

*Primary Examiner*—Alonzo Chambliss

(57) ABSTRACT

An improved flip chip assembly is disclosed of the type where a semiconductor chip having a certain thermal expansion coefficient is directly mounted via solder bumps on the metallization pattern of a circuit substrate having a different thermal expansion coefficient. A base layer comprised of a polymer material is disposed over the surface of the chip, between the chip and the substrate, and the solder bumps are placed over the base layer; the base layer modifies the effective thermal expansion coefficient of the solder bumps to approximate that of the substrate, thus reducing the thermal expansion coefficient differential at the junction of the chip and the substrate.

12 Claims, 4 Drawing Sheets

METHOD OF FABRICATING FLIP CHIP SEMICONDUCTOR DEVICE UTILIZING POLYMER LAYER FOR REDUCING THERMAL EXPANSION COEFFICIENT DIFFERENTIAL

CROSS REFERENCE TO RELATED APPLICATIONS

This application is a divisional of U.S. patent application Ser. No. 09/609,582, now U.S. Pat. No. 6,441,473, filed on Jun. 30, 2000. U.S. Application Ser. No. 09/609,582, is a continuation-in-part of United States patent application Ser. No. 08/928,939, now abandoned, filed on Sep. 12, 1997. Application Ser. Nos. 09/609,582 and 08/928,939 are hereby incorporated herein by reference.

FIELD OF THE INVENTION

The present invention relates to a flip chip semiconductor assembly for mounting a chip to a substrate via solder bumps. More particularly, it relates to a flip chip assembly in which a base layer is disposed between the chip and solder bumps to reduce the thermal expansion coefficient differential at the juncture of the chip and the substrate.

BACKGROUND OF THE INVENTION

A flip chip assembly involves mounting at least one bare silicon chip to a circuit board or laminate substrate. FIG. 1, for example, shows a typical prior art flip chip assembly device 8. Referring to FIG. 1, each silicon chip 10 has at least one (and likely a plurality of) bond pad electrodes 12 formed on its active surface. A plurality of solder bumps 14 are formed on the pads, the solder bumps typically projecting from the pad at a height of approximately 100 μm. The chip 10 is mounted on the circuit substrate 16 by connecting the solder bumps 14 to the metallization pattern fabricated on the substrate, e.g., via substrate electrodes 18. The flip-chip technique is used in high performance devices and portable electronics to achieve devices that are low in weight, have high functionality, and are low in cost.

A drawback with the flip chip assembly, however, relates to differences in the thermal expansion coefficients of the chip 10 and the substrate 16. The temperature of a semiconductor chip typically will rise during operation. Heat generated from the chip will be transmitted to the substrate through the solder bumps, thus raising the temperature of the substrate. The chip and substrate will then thermally expand. Often with flip-chip semiconductor devices, there will be a difference between the thermal expansion coefficient of the chip and the substrate. The chip is generally comprised of silicon (with a thermal expansion coefficient of approximately 2.5–3.0 ppm/° C.) and the substrate is often comprised of a fiber reinforced material, laminated glass plates impregnated with epoxy (with a thermal expansion coefficient of approximately 16–18 ppm/° C.) or a ceramic substrate (with a thermal expansion coefficient of approximately 6 ppm/° C.). Thermal stresses caused by this differential will concentrate in the solder bumps, causing premature failure of the solder bumps and degrading the long-term reliability of the semiconductor device.

To enhance the life of a flip-chip device, underfill epoxy materials have been used and placed between the chips and the substrate. However, the use of underfill materials requires extra processing, making the assembly process cumbersome and time-consuming. Underfill epoxy materials are also expensive.

As may be appreciated, those in the field of communications systems and in particular semiconductor devices continue to seek to develop new configurations that improve efficiency of manufacture and device performance. These and further advantages of this invention may appear more fully upon consideration of the detailed description below.

SUMMARY OF THE INVENTION

Summarily described, the invention embraces a semiconductor device comprising a semiconductor chip with its active side mounted on a substrate. The substrate has a predetermined thermal expansion coefficient different from that of the chip. To address the thermal expansion coefficient differential between the substrate and the chip, a monolithically-deposited base layer with two major surfaces is placed on the chip, the first major surface of the base layer being disposed on the active side of the chip and the second major surface of the base layer being disposed adjacent the substrate. At least one bond pad is disposed on the chip and coupled to the second major surface of the base layer. Solder bumps are disposed over the base layer and coupled to the bond pads. The solder bumps experience an effective thermal expansion coefficient which depends on the base layer thickness, and the base layer reduces the thermal expansion coefficient differential at the junction of the chip and the substrate. The base layer is preferably comprised of a polymeric material and may be deposited on a wafer level.

The invention further pertains to a method of preparing a plurality of semiconductor chips for mounting to circuit substrates. The method comprises providing a plurality of chips on a wafer, each of which chip has at least one bond pad thereon. A polymer layer is monolithically deposited over the plurality of chips and bond pads, and then the polymer layer is removed in the regions of the bond pads to expose the bond pads. An interconnect metallic layer is placed over the plurality of chips to connect the bond pads to the surface of the polymer layer, and solder bumps are placed on the interconnect metallic layer.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Figure 1:
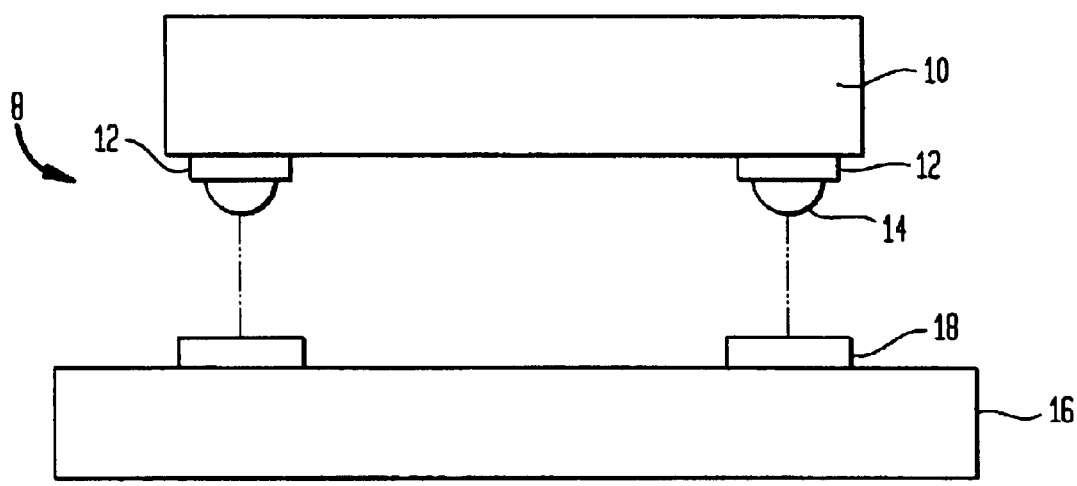
FIG. 1 shows a cross-sectional view of a prior art semiconductor flip chip device.

FIG. 1 shows a cross-sectional view of a prior art flip chip assembly device which has been previously described. The invention reduces the thermal expansion coefficient between the chip 10 and substrate 16 of FIG. 1 without use of underfill epoxy materials and with use of a monolithically deposited polymer layer. Notably, the invention is described with reference to an individual chip and the invention could be practiced in that fashion. However, one of the advantages of this invention is that the flip chip assembly can be prepared on a wafer level i.e., where a plurality of chips can be substantially simultaneously prepared for mounting on a wafer. With this invention, the thermal expansion coefficient experienced by the solder bumps is modified to approximate that of the substrate, thus reducing the thermal expansion coefficient differential at the juncture of the chip and the substrate and improving the fatigue life of the device.

Figure 2A:
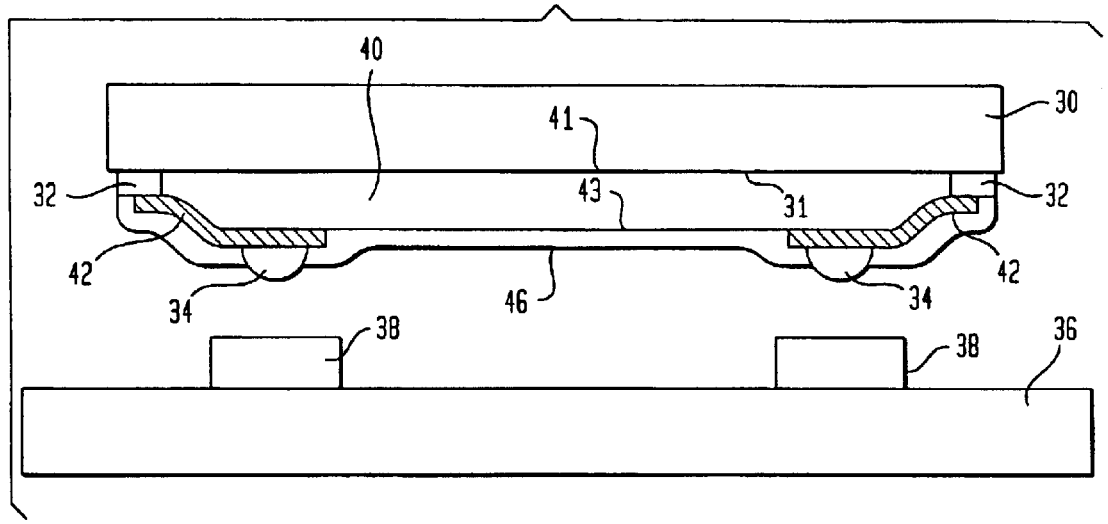
FIG. 2A shows a cross-sectional view of one embodiment of the inventive flip chip device.

More particularly with reference to the figures, FIG. 2A shows a cross-sectional view of one embodiment of the invention. The semiconductor device comprises a chip 30 with an active side 31 on which is disposed at least one (and likely a plurality of) bond pad electrodes 32 (two are shown). The chip 30 has an assembly adapted for mounting to the substrate 36. The bond pad electrodes may comprise aluminum metallized pads, although any material known in the art for fabricating bond pad electrodes may be used. At least two (and likely a greater plurality of) solder bumps 34 are provided for connecting the chip 30 to the substrate 36 (two solder bumps are shown). The solder bumps 34 are adapted for connection to the metallization pattern or electrodes 38 of the substrate. The solder bumps 34 may be fabricated with gold, a mixture of gold-tin, lead-tin, indium-tin, or other compositions known in the art for soldering a chip to a substrate.

A base or polymer layer 40 is disposed over the active side 31 of the chip, in the center of the chip between the bond pads 32. The base layer may be comprised of a single polymer layer or multiple laminates or layers. In any case, the base layer 40 has a first major surface 41 and a second major surface 43, with the first surface being placed over the active side of the chip 31, and the second surface supporting the bond pads 34. The base layer 40 is a monolithically-deposited layer. That is, during fabrication it is deposited over the chip surface and bond pads thereon as a "blanket" layer, and then portions of the base layer are removed to expose the bond pads. As such, the base layer abuts the bonds pads as shown (e.g., the word "abut" meaning to touch along a border). The use of the monolithically-deposited layer eases the fabrication steps, enables fabrication of the chip assembly on a wafer level, and provides for a stable interconnect layer. An interconnect metallic layer 42 overlies the base layer and couples the bond pads 32 to the second surface of the base layer 43 and the solder bumps 34, with the solder bumps being disposed on the metallic layer 43. Since the base layer abuts the bond pads and the metallic layer is deposited thereover, the underside of the metallic layer is continuously supported and is therefore a stable layer. Thus, there is no requirement for use of a further encapsulant to protect the metallic interconnect layer, as in U.S. Pat. No. 5,148,266 to Khandros et al. Optionally, however, a top layer 46, preferably comprised of polymer material may be used for confining the solder bumps to the pad region and preventing solder spreading. The top polymer layer is particularly advantageous when the solder bumps comprise eutectic solder.

The base layer 40 addresses the thermal expansion coefficient differential at the juncture of the chip and substrate. The substrate 36 has a first thermal expansion coefficient, and the chip 30 has a second thermal expansion coefficient different from the first to define a thermal expansion coefficient differential. This differential is reduced by the base layer. It has been discovered that with the use of the base layer, the solder bumps will experience a modified effective thermal expansion coefficient, depending on the base layer thickness and properties. This modified thermal expansion coefficient serves to reduce the thermal expansion coefficient differential, thereby improving the fatigue life of the device.

The base layer may be comprised of polymers such as dielectric laminate materials, including benzocyclobutene, commonly known as BCB, polyimide, and polytetrafluoroethene. Photosensitive polyimides, such as polyimide-isoindolo-quinazolinedione, one version of which is sold by Hitachi Corporation under the tradename PIQ-13, and polyphenyl quinoxaline, which is commonly sold in the industry under the tradename PPQ, advantageously may be used. However, any photo-definable dielectric polymer satisfying the adhesive and thermal expansion coefficient properties revealed herein may be used, i.e., a polymer that will adhere to the chip and interconnect metallic layer while modifying the thermal expansion coefficient experienced by the solder bumps to approximate that of the substrate.

Depending on the materials used, the thickness of the base layer may be adjusted. For example, when a base layer of 0.03 millimeters in thickness is used, the effective thermal expansion coefficient of the solder bumps as modified by the base layer is 5–7 ppm/° C. When a base layer of 0.2 millimeters in thickness is used, the effective thermal expansion coefficient of the solder bumps is 14–15 ppm/° C. Preferably, the effective thermal expansion coefficient of the solder bumps (as modified by the base layer) should match the thermal expansion coefficient of the substrate, which is generally about 16–18 ppm. It has been found that a base layer of from 0.1 to 0.3 millimeters in thickness is advantageous for this purpose.

The interconnect metallic layer 42 should be fabricated with a conductive material. Copper, nickel, gold, or compositions of these materials advantageously may be used. The metallic layer 42 comprises a thin layer of conductive material, preferably sputtered on the device, for coupling the bond pads 32 to the top surface 43 of the base layer, so it is sufficient if the metallic layer is of a thickness of 1–4 $\mu$m. The metallic layer 42 adheres well to the underlying base layer. The composition of the top layer 46 is not as critical as the composition of the base layer 40; the top layer 46 serves effectively as a mask for retaining the solder bumps 34 within a geometrically confined region. Thus, a different composition may be used for the top layer 46, depending upon cost and supply constraints. The top layer 46 is also, however, advantageously comprised of a polymer material.

Figure 2B:
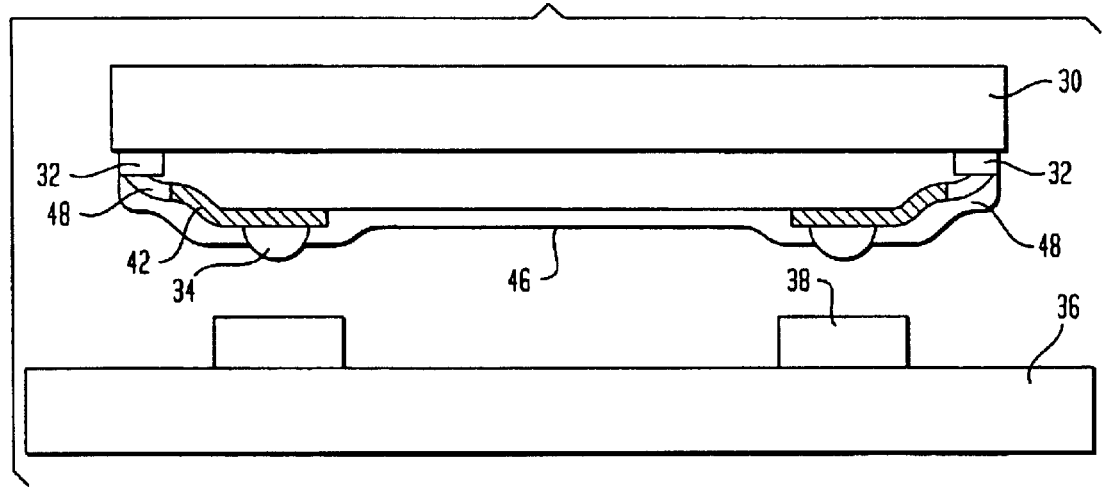
FIG. 2B shows a cross-sectional view of another embodiment of the inventive flip chip device.

Referring to FIG. 2B, there is shown a cross-sectional view of an alternative embodiment of the semiconductor device. The same character references are used to refer to like features as in FIG. 2A. However, with this embodiment, the metallic layer 42 is sputtered over a portion of the base layer 40, without necessarily connecting the solder bump 34 to the bond pad 32. A conductive wire 48 is connected at one end to the bond pad 32 and at the other end to the metallic layer 42, for coupling the bond pad 32 to the top of the base layer 40 and solder bumps 34. The wire bond 48 is advantageous in ensuring the integrity of the connections between the bond pad 32, the surface 43 of the base layer, and the solder bumps 34 during operation of the device. Although use of the conductive wire 48 requires additional processing steps as compared with the embodiment of FIG. 2A, the FIG. 2B embodiment may be prepared on a wafer level given the use of monolithically-deposited base layer.

Figure 3A:
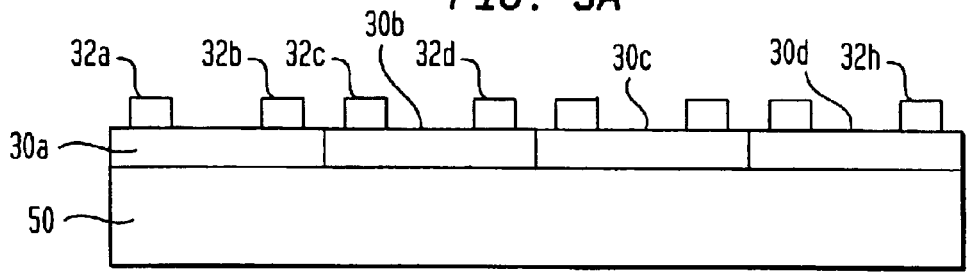
FIGS. 3A–3G show cross-sectional views of a plurality of chips at stages of fabrication to prepare a plurality of flip-chip devices having the configuration shown in FIG. 2A.
Figure 3B:
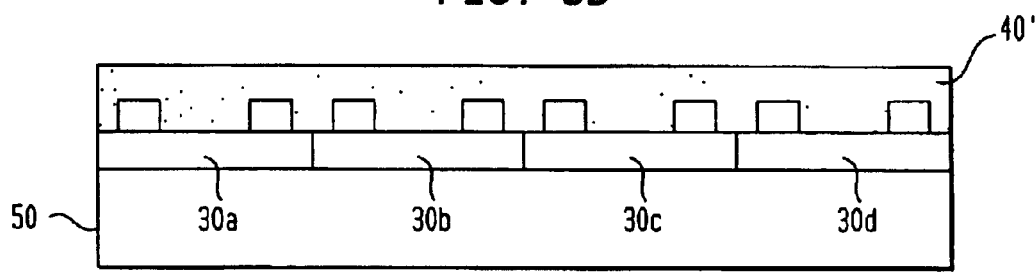

Referring to FIGS. 3A through 3G, there are shown cross-sectional views of a plurality of chips during various stages of fabrication to produce the individual assembly of FIG. 2A. The method is described on a wafer level with a plurality of chips being mounted on the substrate, and it is contemplated that the fabrication will be carried out in this fashion to maximize production efficiencies. However, the fabrication could be carried out at a chip level also. Referring to FIG. 3A, a plurality of semiconductor chips 30a, 30b, 30c, 30d, are provided on wafer 50. Each of the chips has one or more bond pads 32a, 32b, 32c, etc., on its active side. The bond pads may be disposed adjacent the periphery of each chip, or they may be found at other locations on the chip, which is another advantage of this invention (e.g., the location of the bond pads on the chip is not critical to enabling the fabrication). Then, a first step as shown in FIG. 3B is to monolithically apply a base layer 40' to the chip, which is preferably comprised of polymeric material. The polymer is advantageously applied in a liquid or laminate form and then baked to a semi-hardened state. One or more layers of polymer may be applied to form the base layer. The thickness of the base layer is important in the operation of the invention, i.e., for modifying the effective thermal expansion coefficient of the solder bumps, as previously described. Thus, to achieve the desired thickness, the polymer can be sprayed, spun, or laminated over the chip, preferably in a deliberate manner.

Figure 3C:
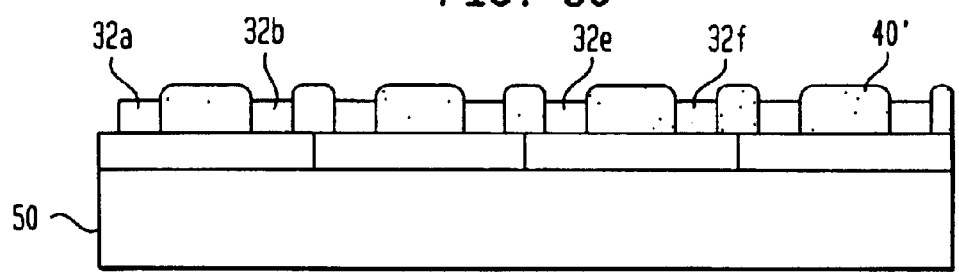
Figure 3D:
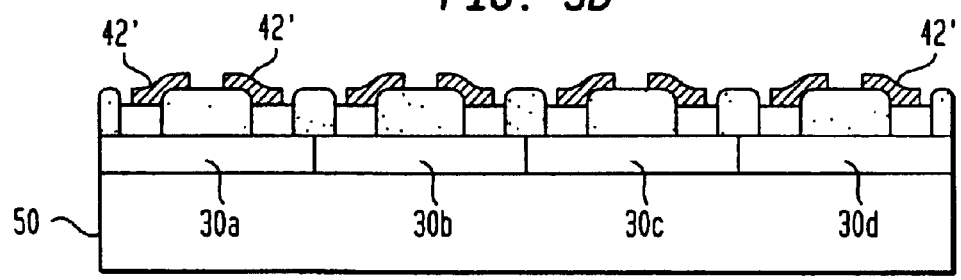

Once a base layer having the desired thickness is applied over the chip, the polymer (or other material forming the base layer) should be etched away in the region of the bond pads to expose all or part of the pads as shown in FIG. 3C. This removal of the base layer at the bond pads can be achieved by using photodefinable polymers. Once the bond pads are exposed, metals are deposited by sputtering or evaporation over the chip to form an interconnect metallic layer 42'. Methods for interconnect layer wafer deposition are well known and can be applied for this step of the method. FIG. 3D illustrates the plurality of chips with the metallic layer applied. Advantageously, a removable polymer mask first can be applied before the conductive metals are sputtered on the chip, so that the removable polymer mask will define the region for deposition of the metallic layer. Polymers that advantageously may be used for this disposable mask layer comprise photodefinable mask polymers, which are well known.

Figure 3E:
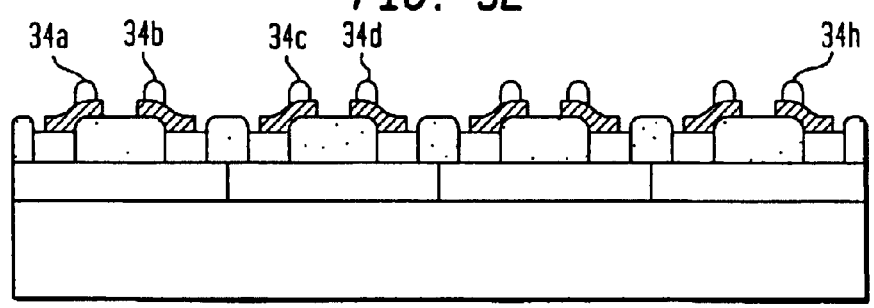
Figure 3F:
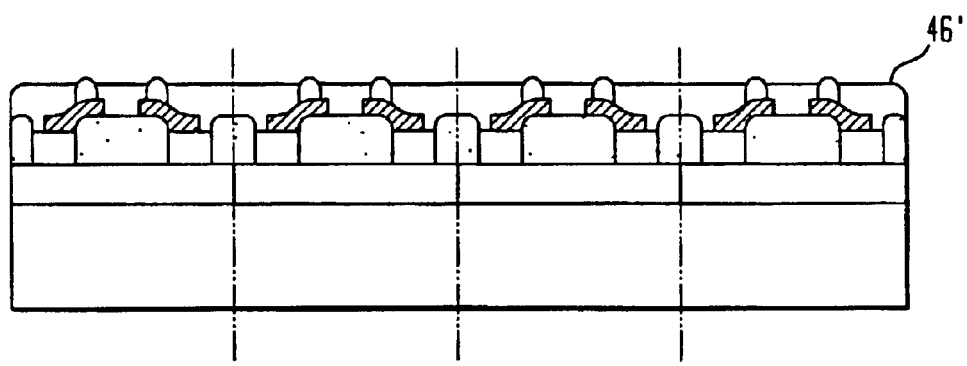
Figure 3G:
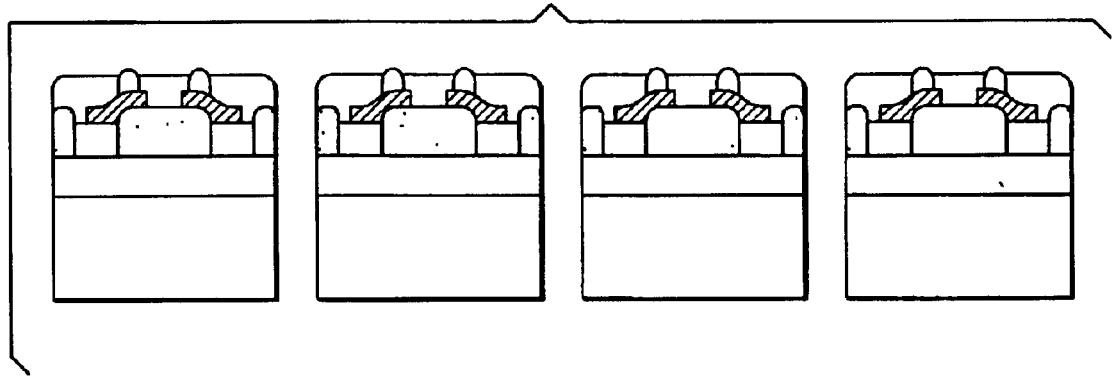

As next shown in FIG. 3E, solder bumps 34a, 34b, 34c, . . . 34h are then deposited over the metallic layer. Again, a polymer mask (or top layer) first can be applied over the chip before the solder bumps are deposited to define the geometrical region for the bumps and confine solder spreading, as illustrated in FIG. 3F. This polymer mask need not be removed, forming the top layer 46' of the device (FIG. 3F). At this or an earlier point in the fabrication process, the wafer is diced so that individual chips (FIG. 3G) are provided for mounting to the circuit substrate, and known methods for soldering a flip chip to a circuit substrate may be used for this purpose. It will be appreciated that the wafer can be diced into chips at any point during the fabrication process, but advantageously the dicing is performed either before or after the step of depositing the solder bumps to maximize the wafer-level deposition.

Additionally, a conductive wire can be connected at one end to the bond pads and at the other end to the interconnect metallic layer, for coupling the bond pad to the top surface 43 of the base layer and solder bumps, to provide the embodiment of FIG. 2B. As previously described, the wire bond may be advantageous in promoting the integrity of the connections between the bond pad, base layer surface, and solder bumps during later operation of the device. In the event the reliability of the connection between the bond pads and base layer may be adversely affected during operation of the device, the wire bond provides an additional measure of reliability with the connections.

It will be understood that the embodiments described herein are merely exemplary and that a person skilled in the art may make variations and modifications without departing from the spirit and scope of the invention. All such variations and modifications are intended to be included within the scope of the appended claims.

I claim:

1. A method of preparing a semiconductor chip for mounting to a circuit substrate having a first thermal expansion coefficient, the method comprising the steps of:
   (a) providing a semiconductor chip having at least one bond pad disposed on its active side and a second thermal expansion coefficient different from the first thermal expansion coefficient;
   (b) monolithically applying a polymer over the surface of the active side of the chip and the at least one bond pad to form a polymer layer;
   (c) removing the polymer layer from the bond pad, the layer abutting the bond pad;
   (d) depositing an interconnect metallic layer over a portion of the surface of the polymer layer for coupling the bond pad to the surface of the polymer layer; and
   (e) disposing at least one solder bump on the polymer layer, the solder bump being in registration with the metallic layer for coupling the solder bump to the bond pad,
   wherein the step of monolithically applying the polymer is controlled to provide the polymer layer with a particular thickness that causes the at least one solder bump to have an effective thermal expansion coefficient, as modified by the polymer layer, between the first thermal expansion coefficient and the second thermal expansion coefficient.

2. The method according to claim 1, in which the step of applying the metallic layer comprises (i) applying a removable polymeric mask over the surface of the chip to define a surface region for application of the interconnect metallic layer; and (ii) removing the polymeric mask once the interconnect metallic layer has been applied.

3. A method for preparing a plurality of semiconductor chips for mounting to at least one circuit substrate having a first thermal expansion coefficient, the method comprising the steps of:
   (a) providing a plurality of semiconductor chips on a wafer, each of the plurality of semiconductor chips having an active side on one side of the wafer, thereby defining a plurality of active sides, wherein at least one bond pad is disposed on each active side to define a plurality of bond pads;
   (b) monolithically applying a polymer layer over the wafer so that the polymer layer is disposed over the plurality of active sides and plurality of bond pads;
   (c) removing portions of the polymer layer to expose the plurality of bond pads, the layer abutting the plurality of bond pads; and
   (d) depositing metal over the wafer so that an interconnect metallic layer couples a portion of the surface of the polymer layer to the plurality of bond pads; and
   (e) disposing a plurality of solder bumps on the interconnect metallic layer,
   wherein the at least one substrate has a first thermal expansion coefficient, and the plurality of semiconductor chips have a second thermal expansion coefficient different from the first thermal expansion coefficient, thereby defining a thermal expansion coefficient differential, and wherein the step of monolithically applying the polymer is controlled to provide the polymer layer with a particular thickness that reduces the thermal expansion coefficient differential when the plurality of semiconductor chips are mounted to the at least one substrate.

4. The method of claim 3, further comprising a step of dicing the wafer to separate the plurality of semiconductor chips to provide individual semiconductor chips.

5. The method of claim 4 in which the step of dicing the wafer is performed before the step of disposing the plurality of solder bumps.

6. The method of claim 4 in which the step of dicing the wafer is performed after the step of disposing the plurality of solder bumps.

7. A method of preparing a semiconductor chip for mounting to a circuit substrate having a first thermal expansion coefficient, the method comprising the steps of:

(a) providing a semiconductor chip having at least one bond pad disposed on its active side and a second thermal expansion coefficient different from the first thermal expansion coefficient;

(b) monolithically applying a polymer over the surface of the active side of the chip and the at least one bond pad to form a polymer layer;

(c) removing the polymer layer from the bond pad, the layer abutting the bond pad;

(d) depositing an interconnect metallic layer over a portion of the surface of the polymer layer for coupling the bond pad to the surface of the polymer layer; and (e) disposing at least one solder bump on the polymer layer, the solder bump being in registration with the metallic layer for coupling the solder bump to the bond pad, wherein the step of monolithically applying the polymer is controlled to provide the polymer layer with a particular thickness that causes the at least one solder bump to have an effective thermal expansion coefficient, as modified by the polymer layer, substantially equal to the first thermal expansion coefficient.

8. The method according to claim 7, in which the step of applying the metallic layer comprises (i) applying a removable polymeric mask over the surface of the chip to define a surface region for application of the interconnect metallic layer; and (ii) removing the polymeric mask once the interconnect metallic layer has been applied.

9. A method for preparing a plurality of semiconductor chips for mounting to at least one circuit substrate having a first thermal expansion coefficient, the method comprising the steps of:

(a) providing a plurality of semiconductor chips on a wafer, each of the plurality of semiconductor chips having an active side on one side of the wafer, thereby defining a plurality of active sides, wherein at least one bond pad is disposed on each active side to define a plurality of bond pads;

(b) monolithically applying a polymer layer over the wafer so that the polymer layer is disposed over the plurality of active sides and plurality of bond pads;

(c) removing portions of the polymer layer to expose the plurality of bond pads, the layer abutting the plurality of bond pads; and (d) depositing metal over the wafer so that an interconnect metallic layer couples a portion of the surface of the polymer layer to the plurality of bond pads; and (e) disposing a plurality of solder bumps on the interconnect metallic layer, wherein the at least one substrate has a first thermal expansion coefficient, and wherein the step of monolithically applying the polymer is controlled to provide the polymer layer with a particular thickness that causes the at least one solder bump to have an effective thermal expansion coefficient, as modified by the polymer layer, substantially equal to the first thermal expansion coefficient.

10. The method of claim 9, further comprising a step of dicing the wafer to separate the plurality of semiconductor chips to provide individual semiconductor chips.

11. The method of claim 10 in which the step of dicing the wafer is performed before the step of disposing the plurality of solder bumps.

12. The method of claim 10 in which the step of dicing the wafer is performed after the step of disposing the plurality of solder bumps.

* * * * *